(12) United States Patent
Zhang et al.

(10) Patent No.: US 10,497,721 B2
(45) Date of Patent: Dec. 3, 2019

(54) ARRAY SUBSTRATE, MANUFACTURING METHOD THEREOF, MAINTENANCE METHOD THEREOF, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Shiju Zhang, Beijing (CN); Guoquan Liu, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/778,780

(22) PCT Filed: Nov. 24, 2017

(86) PCT No.: PCT/CN2017/112759
§ 371 (c)(1),
(2) Date: May 24, 2018

(87) PCT Pub. No.: WO2018/205553
PCT Pub. Date: Nov. 15, 2018

(65) Prior Publication Data
US 2019/0035812 A1    Jan. 31, 2019

(30) Foreign Application Priority Data
May 12, 2017    (CN) .......................... 2017 1 0336054

(51) Int. Cl.
*H01L 27/12*    (2006.01)
*G02F 1/1362*   (2006.01)
(Continued)

(52) U.S. Cl.
CPC .......... *H01L 27/124* (2013.01); *G02F 1/1309* (2013.01); *G02F 1/133516* (2013.01);
(Continued)

(58) Field of Classification Search
CPC ................ H01L 27/124; G02F 1/1309; G02F 1/133516; G02F 1/136259;
(Continued)

(56) References Cited

U.S. PATENT DOCUMENTS

2007/0158655 A1    7/2007  Lin
2008/0174713 A1*   7/2008  Cheng ............... G02F 1/136259
                                                          349/54
(Continued)

FOREIGN PATENT DOCUMENTS

CN    101666948 A    3/2010
CN    101776830 A    7/2010
(Continued)

OTHER PUBLICATIONS

Search Report and Written Opinion for International Application No. PCT/CN2017/112759 dated Feb. 24, 2018.

*Primary Examiner* — Sitaramarao S Yechuri
(74) *Attorney, Agent, or Firm* — Calfee, Halter & Griswold LLP

(57) ABSTRACT

An array substrate, a manufacturing method and a maintenance method thereof, and a display device. The array substrate includes a base substrate, a signal line layer, a color filter layer, and a common line layer. The signal line layer includes multiple signal lines. The common line layer includes a plurality of first common lines and second common lines. An orthographic projection of each signal line on the base substrate is substantially parallel to an orthographic projection of each second common line on the base substrate. An orthographic projection of each signal line on the (Continued)

base substrate and orthographic projections of the plurality of first common lines on the base substrate have overlapping areas. A via hole penetrates the color filter layer, and an orthographic projection of the via hole on the base substrate at least partially overlaps the overlapping area.

16 Claims, 2 Drawing Sheets

(51) Int. Cl.
 *G02F 1/1335* (2006.01)
 *G02F 1/13* (2006.01)

(52) U.S. Cl.
 CPC .. *G02F 1/136259* (2013.01); *G02F 1/136286* (2013.01); *H01L 27/1244* (2013.01); *G02F 2001/133521* (2013.01); *G02F 2001/136263* (2013.01); *G02F 2001/136295* (2013.01)

(58) Field of Classification Search
 CPC ... G02F 1/136286; G02F 2001/133521; G02F 2001/136263; G02F 2001/136295
 See application file for complete search history.

(56) References Cited

U.S. PATENT DOCUMENTS

| | | | |
|---|---|---|---|
| 2010/0155734 | A1 | 6/2010 | Lee et al. |
| 2010/0265424 | A1* | 10/2010 | Chiu ................. G02F 1/136259 349/54 |
| 2011/0194041 | A1* | 8/2011 | Cheng ............... G02F 1/136259 349/38 |
| 2016/0291435 | A1* | 10/2016 | Que .................. G02F 1/134363 |
| 2016/0363829 | A1* | 12/2016 | Li ..................... G02F 1/133345 |
| 2017/0090262 | A1* | 3/2017 | Itou .................. G02F 1/136286 |
| 2018/0088365 | A1 | 3/2018 | Zhao et al. |

FOREIGN PATENT DOCUMENTS

| | | |
|---|---|---|
| CN | 104516133 A | 4/2015 |
| CN | 105759522 A | 7/2016 |
| CN | 106950774 A | 7/2017 |

* cited by examiner

_US 10,497,721 B2_

ARRAY SUBSTRATE, MANUFACTURING METHOD THEREOF, MAINTENANCE METHOD THEREOF, AND DISPLAY DEVICE

CROSS REFERENCE TO RELATED APPLICATIONS

The present application is the U.S. national phase entry of PCT/CN2017/112759, with an international filling date of Nov. 24, 2017, which claims the benefit of Chinese Patent Application No. 201710336054.9, filed on May 12, 2017, the entire disclosure of which is incorporated herein by reference.

TECHNICAL FIELD

The present disclosure relates to the field of display technologies, particularly to an array substrate, a manufacturing method and a maintenance method thereof, and a display device.

BACKGROUND

Color-filter on Array (COA) is a technology that integrates a color filter substrate with an array substrate. It forms a color filter layer on the signal line layer of an array substrate to make up the array substrate.

For a completed array substrate, if the signal line in the array substrate is disconnected, the array substrate is usually maintained in the following manner: firstly boring a hole in the color filter layer until the hole reaches the signal line layer, and then performing continuous deposition at the position where the hole is bored using particles (for example, tungsten powder) generated by a photothermal reaction to form a film, thereby connecting the disconnected signal line.

SUMMARY

An embodiment of the present disclosure provides an array substrate comprising a base substrate. A signal line layer, a color filter layer, and a common line layer are successively provided on the base substrate, the common line layer being insulated from the signal line layer. The signal line layer includes a plurality of substantially parallel signal lines, the common line layer includes a plurality of substantially parallel first common lines and a plurality of substantially parallel second common lines, wherein the first common line is connected with the second common line in an intersecting manner. An orthographic projection of the signal line on the base substrate is substantially parallel to an orthographic projection of the second common line on the base substrate. An orthographic projection of each signal line on the base substrate and an orthographic projection of each of the plurality of first common lines on the base substrate have an overlapping area. The color filter layer has a via hole penetrating the color filter layer, an orthographic projection of the via hole on the base substrate at least partially overlaps the overlapping area.

In some embodiments, the first common lines and the second common lines form a grid-like structure, and the signal line passes through a grid region of the grid-like structure.

In some embodiments, the first common line and the second common line are perpendicular to each other, and the orthographic projection of the first common line on the base substrate and the orthographic projection of the signal line on the base substrate are perpendicular to each other.

In some embodiments, the color filter layer includes a black matrix and a color resist arranged in a stacked manner.

In some embodiments, the array substrate further comprises a common electrode electrically connected to the common line layer.

Another embodiment of the disclosure provides a display device comprising the array substrate according to any one of foregoing embodiments.

A further embodiment of the disclosure provides a manufacturing method for an array substrate, comprising: providing a base substrate, forming a signal line layer on the base substrate, the signal line layer including a plurality of substantially parallel signal lines, forming a color filter layer above a surface of the signal line layer facing away from the base substrate, and forming a via hole penetrating the color filter layer by a patterning process; and forming a plurality of substantially parallel first common lines and a plurality of substantially parallel second common lines above a surface of the color filter layer facing away from the base substrate, the first common line being connected with the second common line in an intersecting manner. An orthographic projection of the signal line on the base substrate is substantially parallel to an orthographic projection of the second common line on the base substrate, an orthographic projection of each signal line on the base substrate and an orthographic projection of each of the plurality of first common lines on the base substrate have an overlapping area, and the via hole corresponds to the overlapping area.

In some embodiments, the color filter layer comprises a black matrix and a color resist, and steps of forming the color filter layer above the surface of the signal line layer facing away from the base substrate, and forming the via hole penetrating the color filter layer by a patterning process comprise: forming the black matrix above the surface of the signal line layer facing away from the base substrate; forming the color resist on a surface of the black matrix facing away from the base substrate, and forming the via hole penetrating the color resist and the black matrix by a patterning process.

In some embodiments, the color filter layer comprises a black matrix and a color resist, and steps of forming the color filter layer above the surface of the signal line layer facing away from the base substrate, and forming the via hole penetrating the color filter layer by a patterning process comprise: forming the black matrix above the surface of the signal line layer facing away from the base substrate, and forming a black matrix via hole penetrating the black matrix by a patterning process, the black matrix via hole corresponding to the overlapping area, forming a color resist on a surface of the black matrix facing away from the base substrate, and forming a color resist via hole penetrating the color resist by a patterning process, so that the color resist via hole is in communication with the black matrix via hole, the color resist via hole corresponds to the black matrix via hole, and the color resist via hole and the black matrix via hole form the via hole.

Yet another embodiment of the disclosure provides a maintenance method for an array substrate, which may be used for maintaining the array substrate as described in the above embodiments, the maintenance method comprises: determining a position of a disconnection point in the signal line where disconnection occurs, wherein the signal line where disconnection occurs comprises a first disconnected segment and a second disconnected segment, and the disconnection point is between the first disconnected segment and the second disconnected segment, obtaining an r-th first common line and a k-th first common line, wherein an orthographic projection of the r-th first common line on the base substrate and an orthographic projection of the first disconnected segment on the base substrate have a first overlapping portion, and an orthographic projection of the k-th first common line on the base substrate and an orthographic projection of the second disconnected segment on the base substrate have a second overlapping portion; cutting the r-th first common line at a side of a portion of the r-th first common line that overlaps the first overlapping portion to form two r-th first common segments, wherein one of the r-th first common segments is connected as a first connection segment to the first disconnected segment through the via hole, and cutting the r-th first common segment used as the first connection segment to form two first connection sub-segments, wherein one of the first connection sub-segments is connected to the first disconnected segment, cutting the k-th first common line at a side of a portion of the k-th first common line that overlaps the second overlapping portion to form two k-th first common segments, one of the k-th first common segments is connected as a second connection segment to the second disconnected segment through the via hole, and cutting the k-th first common segment used as the second connection segment to form two second connection sub-segments, one of the second connection sub-segments is connected to the second disconnected segment, obtaining an s-th second common line connected to the first connection sub-segment and the second connection sub-segment, respectively, and cutting the s-th second common line to form three third connection sub-segments, wherein one of three third connection sub-segments connects with the first connection sub-segment and the second connection sub-segment, respectively. The first connection sub-segment, the third connection sub-segment and the second connection sub-segment interconnected with each other are used to transmit signals, each of r, k and s is a positive integer, and r≠k.

In some embodiments, k=r+1.

In some embodiments, the method further comprises steps of: cutting, by means of laser cutting, the r-th first common line at the side of the portion of the r-th first common line that overlaps the first overlapping portion to form two r-th first common segments, melting a portion of the first connection segment that overlaps the first overlapping portion, so that a molten liquid formed after melting passes through the via hole to connect the first connection segment to the first disconnected segment, and cutting, by means of laser cutting, the r-th first common segment used as the first connection segment to form two first connection sub-segments, wherein one of the first connection sub-segments is connected to the first disconnected segment.

In some embodiments, the method further comprises steps of: cutting, by means of laser cutting, the k-th first common line at the side of the portion of the k-th first common line that overlaps the second overlapping portion to form two k-th first common segments, melting a portion of the second connection segment that overlaps the second overlapping portion, so that a molten liquid formed after melting passes through the via hole to connect the second connection segment to the second disconnected segment, and cutting, by means of laser cutting, the k-th first common segment used as the second connection segment to form two second connection sub-segments.

In some embodiments, the s-th second common line is cut by means of laser cutting to form three third connection sub-segments.

BRIEF DESCRIPTION OF THE DRAWINGS

In order to illustrate the technical solutions of embodiments of the disclosure more clearly, the drawings required for description of the embodiments are briefly described below. In the drawings.

DETAILED DESCRIPTION OF EMBODIMENTS

In order to make the objectives, features, and advantages of the technical solutions proposed in embodiments of the disclosure more obvious and easier to understand, the embodiments of the disclosure will be described below with reference to the accompanying drawings.

The inventors of the application realize that, for the array substrate maintenance method of repairing the disconnected signal line by depositing particles generated by a photothermal reaction as mentioned above, the particles generated by a photothermal reaction are directly deposited on the color filter layer, but heat generated from the photothermal reaction may cause damage to the color filter layer, which causes the color filter layer to have defects such as discoloration, surface unevenness, through holes, and the like, and may even cause the array substrate to be scrapped.

Figure 1:
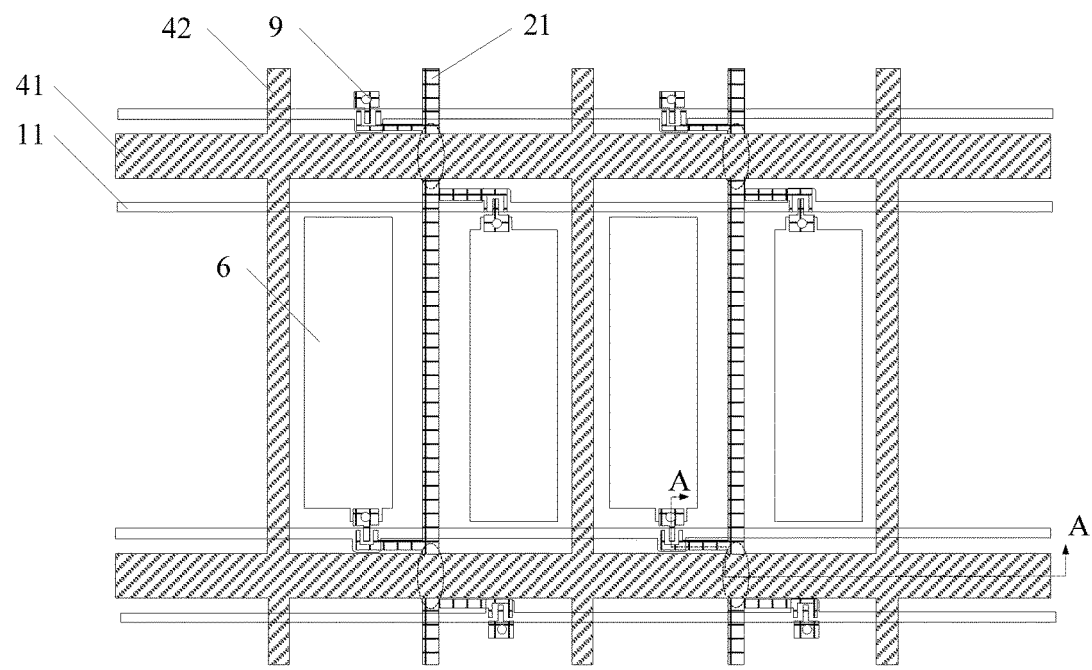
FIG. 1 is a schematic planar diagram illustrating a structure of an array substrate provided by an embodiment of the disclosure.
Figure 2:
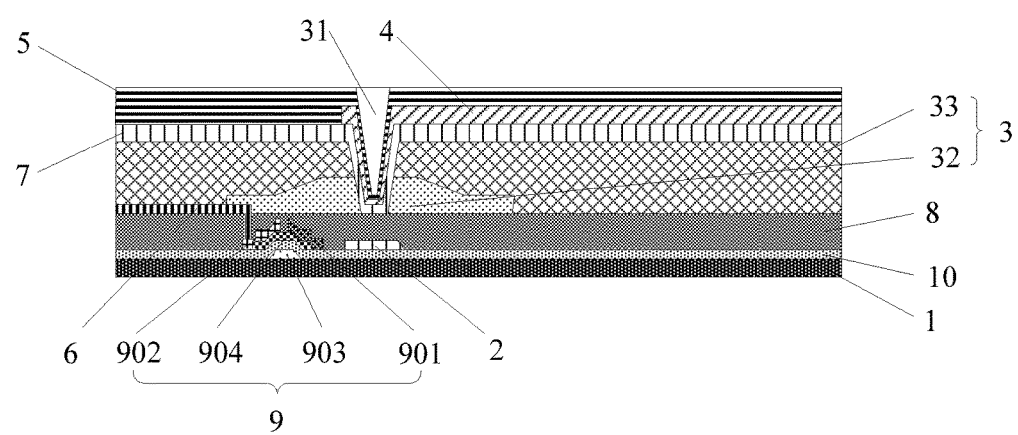
FIG. 2 is a sectional view taken along line A-A in FIG. 1.

An embodiment provides an array substrate. Referring to FIG. 1 to FIG. 2, the array substrate comprises a base substrate 1. Moreover, a signal line layer 2, a color filter layer 3, and a common line layer 4 are successively provided on the base substrate, the common line layer being 4 insulated from the signal line layer 2. The signal line layer 2 includes a plurality of substantially parallel signal lines 21. The common line layer 4 includes a plurality of substantially parallel first common lines 41 and a plurality of substantially parallel second common lines 42, the first common line 41 being connected to the second common line 42 in an intersecting manner. The orthographic projection of the signal line 21 on the base substrate 1 is substantially parallel to that of the second common line 42 on the base substrate 1, and the orthographic projection of each signal line 21 on the base substrate and the orthographic projections of the plurality of first common lines 41 on the base substrate 1 have overlapping areas (as shown by the ellipses in FIG. 3). A portion of the color filter layer 3 corresponding to the overlapping area is provided with a via hole 31 penetrating the color filter layer 3, which also means that the orthographic projection of the via hole 31 on the base substrate 1 at least partially overlaps the overlapping area.

Figure 3:
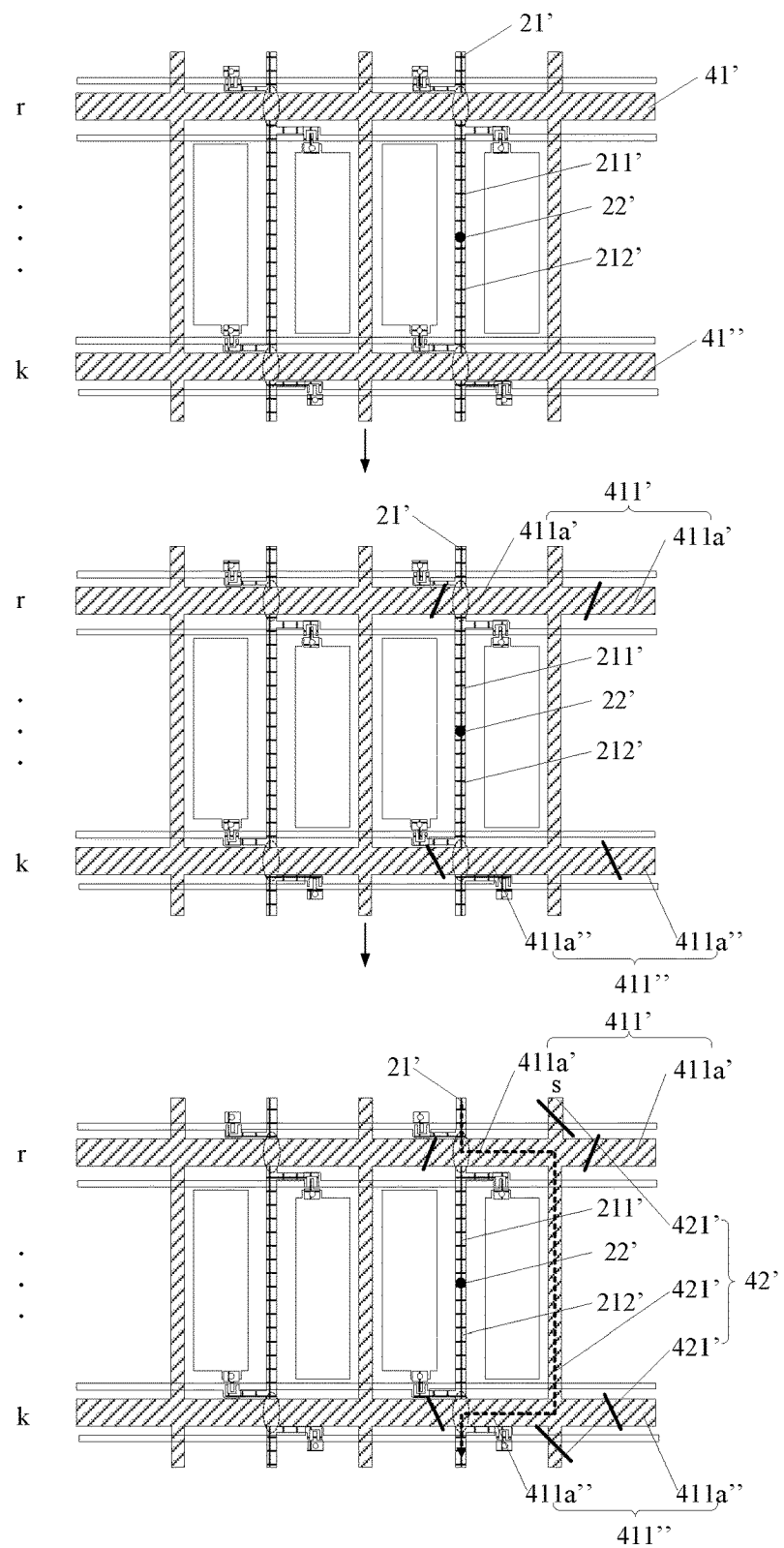
FIG. 3 illustrates steps of a maintenance method provided by an embodiment of the disclosure.

In case the signal line 21 in the signal line layer 2 of the above array substrate undergoes a failure such as disconnection as shown in FIG. 3, it can be repaired by the following maintenance method.

Determining the position of a disconnection point 22' in a disconnected signal line 21' where the disconnection occurs. At that time, the disconnected signal line 21' comprises a first disconnected segment 211' and a second disconnected segment 212', and the disconnection point 22' of the disconnected signal line 21' is located between the first disconnected segment 211' and the second disconnected segment 212'.

Obtaining an r-th first common line 41' and a k-th first common line 41". The orthographic projection of the r-th first common line 41' on the base substrate 1 and that of the first disconnected segment 211' on the base substrate 1 have a first overlapping portion, and the orthographic projection of the k-th first common line 41" on the base substrate 1 and that of the second disconnected segment 212' on the base substrate 1 have a second overlapping portion.

Cutting the r-th first common line 41' at the side of its portion that overlaps the first overlapping portion to form two r-th first common segments 411', one of which is connected as a first connection segment to the first disconnected segment 211' through the via hole 31. The r-th first common segment 411' as the first connection segment is cut to form two first connection sub-segments 411a', one of which is connected to the first disconnected segment 211'.

Cutting the k-th first common line 41" at the side of its portion that overlaps the second overlapping portion to form two k-th first common segments 411", one of which is connected as a second connection segment to the second disconnected segment 212' through the via hole 31. The k-th first common segment 411" as the second connection segment is cut to form two second connection sub-segments 411a", one of which is connected to the second disconnected segment 212'.

Obtaining an s-th second common line 42' connected to the first connection sub-segment 411a' and the second connection sub-segment 411a" respectively.

Cutting the s-th second common line 42' to form three third connection sub-segments 421', one of which is connected to the first connection sub-segment 411a' and the second connection sub-segment 411a", respectively.

In this way, the first connection sub-segment 411a', the third connection sub-segment 421', and the second connection sub-segment 411a" can be used to transmit signals to achieve the maintenance of the array substrate, wherein r≠k, r>0, k>0, s>0.

It is to be noted that in FIG. 3, the cutting position is shown by a thick solid line, and the signal transmission direction after maintenance is shown by a dashed line.

With the array substrate provided by an embodiment of the disclosure, when the signal line 21 of the array substrate undergoes a failure such as disconnection, it is only required to obtain a corresponding r-th first common line 41', k-th first common line 41", and s-th second common line 42', and cut the r-th first common line 41', the k-th first common line 41", and the s-th second common line 42' on the premise that the position of the disconnection point 22' in the disconnected signal line 21' is determined. Because the portion of the color filter layer 3 corresponding to the overlapping area is provided with the via hole 31 penetrating the color filter layer, the first connection sub-segment 411a' and the second connection sub-segment 411a" formed after cutting may be connected to the disconnected signal line 21' through the via hole 31, so that the first connection sub-segment 411a', the third connection sub-segment 421', and the second connection sub-segment 411a" can be used to transmit signals. The heat required for the cutting process is insufficient to cause damage to the color filter layer 3, so that it is possible to repair the failure such as disconnection of the signal line 21 in the array substrate without damaging the color filter layer 3.

By way of example, referring to FIG. 1, the first common line 41 and the second common line 42 constitute a grid-like structure, and the plurality of signal lines 21 pass through the grid regions of the grid-like structure.

Specifically, the first common line 41 and the second common line 42 are perpendicularly connected to each other to form a grid-like structure. The orthographic projection of the first common line 41 on the base substrate 1 is perpendicular to that of the signal line 21 on the base substrate 1, and the orthographic projection of the second common line 42 on the base substrate 1 is parallel to that of the signal line 21 on the base substrate 1, so that the orthographic projections of the first common line 41, the second common line 42, and the signal line 21 on the base substrate 1 can form a regular rectangular grid-like structure, which improves the designability and structural regularity of the array substrate and simplifies the design process.

The color filter layer 3 in the above embodiment may include a black matrix 32 and a color resist 33 that are arranged in a stacked manner. The color resist 33 generally includes a red color resist R, a green color resist G, and a blue color resist B for realizing color display. The black matrix 32 is used for preventing light leakage and color crosstalk between two adjacent color resists.

For the material of the signal line, the first common line and the second common line, it may be a conductive material such as a metal or a metal oxide, which is not limited herein.

In addition, the array substrate further comprises a common electrode 5, a pixel electrode 6, a thin film transistor array, and a gate signal line 11 arranged on the base substrate 1. Each thin film transistor 9 in the thin film transistor array includes a source 901, a drain 902, a gate 903, and an active layer 904 between source 901 and drain 902. The common electrode 5 is electrically connected to the common line layer 4, the source 901 is electrically connected to the signal line 21, the drain 902 is electrically connected to the pixel electrode 5, and the gate 903 is electrically connected to the gate signal line 11. Alternatively, the common electrode 5 may be electrically connected to the common line layer 4, the source 901 may be electrically connected to the pixel electrode 5, the drain 902 may be electrically connected to the signal line 21, and the gate 903 may be electrically connected to the gate signal line 11. When the gate signal line 11 transmits a pulse signal to the gate 903, the thin film transistor is turned on. At that time, if the signal line 21 transmits a voltage signal to the source 901 and the drain 902, the pixel electrode 5 is be charged, so that the deflection of liquid crystals is controlled by the electric field between the common electrode 5 and the pixel electrode 6.

In order to prevent a short circuit between the common line layer 4 and the signal line layer 2, an insulating layer 7 may be disposed between the common line layer 4 and the signal line layer 2. In this way, in the process of manufacturing the array substrate, the common line layer 4 can be directly formed on a surface of the insulating layer 7 facing away from the base substrate 1. The insulating layer 7 is usually of continuous structure and has no via hole, so that it can prevent occurrence of a short circuit caused by the connection of the common line layer 4 to the signal line 21 through the via hole 31 during the manufacturing process.

Likewise, in order to prevent a short circuit between the gate 903 and the signal line 21, a gate insulating layer 10 may be disposed between the gate 903 and the signal line 21.

In order to avoid contact between the color filter layer 3 and the semiconductor in the active layer 904 which affects the characteristics of the thin film transistor 9, a protective layer 8 may be disposed between the thin film transistor array 9 and the color filter layer 3.

Another embodiment of the present disclosure provides a display device comprising the array substrate described in the foregoing embodiment. The display device provided by this embodiment may have the same beneficial effects as the array substrate provided by the foregoing embodiments, which will not be described in detail again.

The display device in this embodiment may be any product or component having a display function, such as a liquid crystal panel, an electronic paper, a mobile phone, a tablet computer, a television, a display, a notebook computer, a digital photo frame, a navigator, and so on.

A further embodiment of the present disclosure provides a manufacturing method for an array substrate, which can be used for manufacturing the array substrate provided by the foregoing embodiments.

The manufacturing method may comprise the following steps: providing a base substrate 1; forming a signal line layer 2 on the base substrate 1, the signal line layer 2 including a plurality of substantially parallel signal lines 21; forming a color filter layer 3 on a surface of the signal line layer 21 facing away from the base substrate 1, and forming a via hole 31 penetrating the color filter layer 3 by a patterning process; forming a plurality of substantially parallel first common lines 41 and a plurality of substantially parallel second common lines 42 on a surface of the color filter layer 3 facing away from the base substrate 1, the first common line 41 being connected to the second common line 42 in an intersecting manner. The orthographic projection of the signal line 21 on the base substrate 1 is substantially parallel to that of the second common line 42 on the base substrate 1, the orthographic projection of each signal line 21 on the base substrate 1 and the orthographic projections of the plurality of first common lines 41 on the base substrate 1 have overlapping areas, and the via hole 31 corresponds to the overlapping area.

The manufacturing method of an array substrate provided by this embodiment may have the same beneficial effects as the array substrate provided by the foregoing embodiments, which will not be described in detail again.

For the method of forming the via hole 31, a one-step method may be used, or two steps may be included. Forming the via hole 31 using a one-step method may comprise the steps of forming a black matrix 32 and a color resist 33 successively on a surface of the signal line layer 2 facing away from the base substrate 1; and forming a via hole 31 penetrating the color resist 33 and the black matrix 32 by a patterning process.

Alternatively, forming the via hole 31 may comprise the following steps: forming a black matrix 32 on a surface of the signal line layer 2 facing away from the base substrate 1, and forming a black matrix via hole 311 penetrating the black matrix 32 by a patterning process; forming a color resist 33 on a surface of the black matrix 32 facing away from the base substrate 1, and forming a color resist via hole 312 penetrating the color resist 33 by a patterning process, so that the color resist via hole 312 is in communication with the black matrix via hole 311, the color resist via hole 312 and the black matrix via hole 311 forming a via hole 31.

Compared to the two-step method, the one-step method is simple and can omit the process of aligning the black matrix via hole 311 to the color resist via hole 312, thereby reducing errors caused by misalignment.

Yet another embodiment of the present disclosure provides a maintenance method for an array substrate. Referring to FIG. 3, this method may be used for maintaining the array substrate provided by the foregoing embodiments of the disclosure. When the signal line 201 of the array substrate is disconnected, the maintenance method comprises the following steps.

Determining the position of a disconnection point 22' in a disconnected signal line 21' where the disconnection occurs, the disconnected signal line 21' comprises a first disconnected segment 211' and a second disconnected segment 212', and the disconnection point 22' of the disconnected signal line 21' is located between the first disconnected segment 211' and the second disconnected segment 212'.

Obtaining an r-th first common line 41' and a k-th first common line 41", the orthographic projection of the r-th first common line 41' on the base substrate 1 and that of the first disconnected segment 211' on the base substrate 1 have a first overlapping portion, and the orthographic projection of the k-th first common line 41" on the base substrate 1 and that of the second disconnected segment 212' on the base substrate 1 have a second overlapping portion.

Cutting the r-th first common line 41' at the side of its portion that overlaps the first overlapping portion to form two r-th first common segments 411', one of which is connected as a first connection segment to the first disconnected segment 211' through the via hole 31; cutting the r-th first common segment 411' used as the first connection segment to form two first connection sub-segments 411a', one of which is connected to the first disconnected segment 211'.

Cutting the k-th first common line 41" at the side of its portion that overlaps the second overlapping portion to form two k-th first common segments 411", one of which is connected as a second connection segment the second disconnected segment 212' through the via hole 31; cutting the k-th first common segment 411" used as the second connection segment to form two second connection sub-segments 411a", one of which is connected to the second disconnected segment 212'.

Obtaining an s-th second common line 42' connected to the first connection sub-segment 411a' and the second connection sub-segment 411a", respectively.

Cutting the s-th second common line 42' to form three third connection sub-segments 421', one of which is connected to the first connection sub-segment 411a' and the second connection sub-segment 411a", respectively.

The first connection sub-segment 411a', the third connection sub-segment 421', and the second connection sub-segment 411a" can be used to transmit signals, thus, the maintenance of the array substrate is completed.

Regarding the above parameters r, k and s, r≠k, r>0, k>0, s>0.

It is to be noted that in FIG. 3, the cutting positions are shown by thick solid lines, and the signal transmission direction after maintenance is shown by a dashed line.

In some embodiments, k=r+1, i.e., the r-th first common line 41' is adjacent to the k-th first common line 41", so that the length of the third connection sub-segment 421 used for transmitting signals can be shortened, thereby ensuring the integrity of the common line layer 4.

The maintenance method of an array substrate provided by this embodiment has the same beneficial effects as the array substrate provided by the foregoing embodiments, which will not be described in detail again.

The cutting process involved in the above embodiment may be performed by laser cutting. The connection between the r-th first common segment 411' and the first disconnected segment 211', and the connection between the k-th first common segment 411" and the second disconnected segment 212' may be performed by melting.

By way of example, the steps of cutting the r-th first common line 41' at the side of its portion that overlaps the first overlapping portion to form two r-th first common segments 411', one of which is connected as a first connection segment to the first disconnected segment 211' through the via hole 31 and cutting the r-th first common segment 411' used as the first connection segment to form two first connection sub-segments 411a', one of which is connected to the first disconnected segment 211' may comprise the following steps: cutting, by means of a laser cutting, the r-th first common line 41' at the side of its portion that overlaps the first overlapping portion to form two r-th first common segments 411'; melting a portion of one of the r-th first common segments 411' that overlaps the first overlapping portion, causing a molten liquid formed after melting passes through the via hole 31 to connect one of the r-th first common segments 411' used as a first connection segment to the first disconnected segment 211'; cutting, using a laser cutting method, the r-th first common segment 411' used as the first connection segment to form two first connection sub-segments 411a', one of the first connection sub-segments 411a' is connected to the first disconnected segment 211'.

Similarly, the steps of cutting the k-th first common line 41" at the side of its portion that overlaps the second overlapping portion to form two k-th first common segments 411", one of which is connected as a second connection segment to the second disconnected segment 212' through the via hole 31 and cutting the k-th first common segment 411" used as the second connection segment to form two second connection sub-segments 411a", one of which is connected to the second disconnected segment 212' may comprise the following steps: cutting, using a laser cutting method, the k-th first common line 41" at the side of its portion that overlaps the second overlapping portion to form two k-th first common segments 411"; melting a portion of one of the k-th first common segments 411" that overlaps the second overlapping portion, so that a molten liquid formed after melting pass through the via hole 31 to connect one of the k-th first common segments 411" used as a second connection segment to the second disconnected segment 212'; cutting, using a laser cutting, the k-th first common segment 411" as the second connection segment to form two second connection sub-segments 411a", one of the second connection sub-segments 411a" is connected to the second disconnected segment 212'.

For the cutting process of the s-th second common line 42', a laser cutting method may also be used to cut the s-th second common line 42' to form three third connection sub-segments 421', one of which is connected to the first connection sub-segment 411a' and the second connection sub-segment 411a", respectively. Specifically, cutting the s-th second common line 42' may comprise the steps of cutting, using a laser cutting method, the s-th second common line 42' to form three third connection sub-segments 421', one of which is connected to the first connection sub-segment 411a' and the second connection sub-segment 411a", respectively.

The above embodiments are only part of embodiments of the invention, but the protection scope of the invention is not so limited. Variations or replacements that can be easily conceived by any skilled person familiar with this technical field within the technical scope revealed by this disclosure shall be encompassed within the scope of the invention. Thus, the protection scope of the invention shall be based on the scope of the appended claims.

The invention claimed is:

1. An array substrate comprising a base substrate, which comprises a signal line layer, a color filter layer, and a common line layer, wherein the signal line layer, the color filter layer, and the common line layer are successively provided on the base substrate, and the common line layer is insulated from the signal line layer, wherein the signal line layer comprises a plurality of substantially parallel signal lines, wherein the common line layer comprises a plurality of substantially parallel first common lines and a plurality of substantially parallel second common lines, wherein the first common lines are connected with the second common lines in an intersecting manner, wherein an orthographic projection of each signal line on the base substrate is substantially parallel to an orthographic projection of each second common line on the base substrate, wherein an orthographic projection of each signal line on the base substrate and an orthographic projection of each of the plurality of first common lines on the base substrate form an overlapping area, wherein the color filter layer comprises a via hole penetrating the color filter layer, and wherein an orthographic projection of the via hole on the base substrate at least partially overlaps the overlapping area, wherein the array substrate further comprises a common electrode electrically connected to the common line layer.

2. The array substrate according to claim 1, wherein the first common lines and the second common lines form a grid-like structure, and the signal lines passes through a grid region of the grid-like structure.

3. The array substrate according to claim 1, wherein the first common lines and the second common lines are perpendicular to each other, and the orthographic projection of each first common line on the base substrate and the orthographic projection of each signal line on the base substrate are perpendicular to each other.

4. The array substrate according to claim 1, wherein the color filter layer further comprises a black matrix and a color resist arranged in a stacked manner.

5. A display device comprising the array substrate according to claim 1.

6. The display device according to claim 5, wherein the first common lines and the second common lines form a grid-like structure, and the signal lines pass through a grid region of the grid-like structure.

7. The display device according to claim 5, wherein the first common lines and the second common lines are perpendicular to each other, and the orthographic projection of each of the first common lines on the base substrate and the orthographic projection of each of the signal lines on the base substrate are perpendicular to each other.

8. The display device according to claim 5, wherein the color filter layer further comprises a black matrix and a color resist arranged in a stacked manner.

9. A maintenance method for an array substrate for maintaining the array substrate according to claim 1, wherein the maintenance method comprises:

determining a position of a disconnection point in the signal lines where disconnection occurs, wherein the signal line where disconnection occurs comprises a first disconnected segment and a second disconnected segment, and the disconnection point is between the first disconnected segment and the second disconnected segment, obtaining an r-th first common line and a k-th first common line, wherein an orthographic projection of the r-th first common line on the base substrate and an orthographic projection of the first disconnected segment on the base substrate have a first overlapping portion, and an orthographic projection of the k-th first common line on the base substrate and an orthographic projection of the second disconnected segment on the base substrate have a second overlapping portion;

cutting the r-th first common line at a side of a portion of the r-th first common line that overlaps the first overlapping portion to form two r-th first common segments, wherein one of the r-th first common segments is connected as a first connection segment to the first disconnected segment through the via hole, cutting the r-th first common segment used as the first connection segment to form two first connection sub-segments, wherein one of the first connection sub-segments is connected to the first disconnected segment, cutting the k-th first common line at a side of a portion of the k-th first common line that overlaps the second overlapping portion to form two k-th first common segments, wherein one of the k-th first common segments is connected as a second connection segment to the second disconnected segment through the via hole, cutting the k-th first common segment used as the second connection segment to form two second connection sub-segments, wherein one of the second connection sub-segments is connected to the second disconnected segment, obtaining an s-th second common line connected to the first connection sub-segment and the second connection sub-segment, respectively, cutting the s-th second common line to form three third connection sub-segments, wherein one of three third connection sub-segments connects with the first connection sub-segment and the second connection sub-segment, respectively, wherein the first connection sub-segment, the third connection sub-segment and the second connection sub-segment interconnected with each other are used to transmit signals, and wherein each of r, k and s is a positive integer, r≠k.

10. The maintenance method for an array substrate according to claim 9, wherein k=r+1.

11. The maintenance method for an array substrate according to claim 9, wherein the method further comprises steps of:

cutting, by means of laser cutting, the r-th first common line at the side of the portion of the r-th first common line that overlaps the first overlapping portion to form two r-th first common segments, melting a portion of the first connection segment that overlaps the first overlapping portion, so that a molten liquid formed after melting passes through the via hole to connect the first connection segment to the first disconnected segment, cutting, by means of laser cutting, the r-th first common segment used as the first connection segment to form two first connection sub-segments, wherein one of the first connection sub-segments is connected to the first disconnected segment.

12. The maintenance method for an array substrate according to claim 9, wherein the method further comprises steps of:

cutting, by means of laser cutting, the k-th first common line at the side of the portion of the k-th first common line that overlaps the second overlapping portion to form two k-th first common segments, melting a portion of the second connection segment that overlaps the second overlapping portion, so that a molten liquid formed after melting passes through the via hole to connect the second connection segment to the second disconnected segment, cutting, by means of laser cutting, the k-th first common segment used as the second connection segment to form two second connection sub-segments.

13. The maintenance method for an array substrate according to claim 9, wherein the s-th second common line is cut by means of laser cutting to form three third connection sub-segments.

14. A manufacturing method for an array substrate, comprising:

providing a base substrate, forming a signal line layer on the base substrate, the signal line layer comprising a plurality of substantially parallel signal lines, forming a color filter layer above a surface of the signal line layer facing away from the base substrate, forming a via hole penetrating the color filter layer, wherein the via hole is formed by a patterning process;

forming a plurality of substantially parallel first common lines and a plurality of substantially parallel second common lines above a surface of the color filter layer facing away from the base substrate, wherein the first common lines are connected with the second common lines in an intersecting manner, and forming a common electrode on the base substrate, wherein the common electrode is electrically connected to the first common lines and the second common lines, wherein orthographic projections of the signal lines on the base substrate are substantially parallel to orthographic projections of the second common lines on the base substrate, wherein an orthographic projection of each signal line on the base substrate and an orthographic projection of each of the plurality of first common lines on the base substrate have an overlapping area, and wherein the via hole corresponds to the overlapping area.

15. The manufacturing method for an array substrate according to claim 14, wherein the color filter layer comprises a black matrix and a color resist, and the steps of forming the color filter layer above the surface of the signal line layer facing away from the base substrate and forming the via hole penetrating the color filter layer by a patterning process comprise:

forming the black matrix above the surface of the signal line layer facing away from the base substrate;

forming the color resist on a surface of the black matrix facing away from the base substrate, and forming the via hole penetrating the color resist and the black matrix by a patterning process.

16. The manufacturing method for an array substrate according to claim 14, wherein the color filter layer comprises a black matrix and a color resist, and the steps of forming the color filter layer above the surface of the signal line layer facing away from the base substrate and forming the via hole penetrating the color filter layer by a patterning process comprise:

forming the black matrix above the surface of the signal line layer facing away from the base substrate, and forming a black matrix via hole penetrating the black matrix by a patterning process, the black matrix via hole corresponding to the overlapping area, forming a color resist on a surface of the black matrix facing away from the base substrate, and forming a color resist via hole penetrating the color resist by a patterning process so that the color resist via hole is in communication with the black matrix via hole, and wherein the color resist via hole corresponds to the black matrix via hole, and the color resist via hole and the black matrix via hole form the via hole penetrating the color filter layer.

* * * * *